United States Patent
Danicich et al.

(10) Patent No.: US 9,661,767 B2
(45) Date of Patent: May 23, 2017

(54) MULTIPLE POSITION MOUNT WITH RETAINING MECHANISM

(71) Applicant: Rosemount Aerospace Inc., Burnsville, MN (US)

(72) Inventors: Jeffrey P. Danicich, Savage, MN (US); Curtis Wicks, Shakopee, MN (US)

(73) Assignee: Simmonds Precision Products, Inc., Vergennes, VT (US)

( * ) Notice: Subject to any disclaimer, the term of this patent is extended or adjusted under 35 U.S.C. 154(b) by 0 days.

(21) Appl. No.: 14/744,330

(22) Filed: Jun. 19, 2015

(65) Prior Publication Data
US 2016/0374215 A1    Dec. 22, 2016

(51) Int. Cl.
| | |
|---|---|
| *F16B 2/18* | (2006.01) |
| *H05K 5/02* | (2006.01) |
| *B60R 11/00* | (2006.01) |
| *F16M 11/04* | (2006.01) |
| *F16M 11/08* | (2006.01) |
| *F16M 13/00* | (2006.01) |
| *F16M 13/02* | (2006.01) |
| *F16C 11/04* | (2006.01) |

(52) U.S. Cl.
CPC ............ *H05K 5/0204* (2013.01); *B60R 11/00* (2013.01); *F16B 2/185* (2013.01); *F16C 11/04* (2013.01); *F16M 11/041* (2013.01); *F16M 11/08* (2013.01); *F16M 13/00* (2013.01); *F16M 13/02* (2013.01)

(58) Field of Classification Search
USPC ..... 248/229.2, 229.22, 229.4, 229.1, 229.12, 248/229.14, 448, 451, 455, 146, 149, 154, 248/917, 918, 919; 361/679.21
See application file for complete search history.

(56) References Cited

U.S. PATENT DOCUMENTS

| | | | |
|---|---|---|---|
| 5,480,115 A | | 1/1996 | Haltof |
| 5,769,369 A | * | 6/1998 | Meinel .................. B60N 3/001 108/45 |

(Continued)

FOREIGN PATENT DOCUMENTS

| | | |
|---|---|---|
| DE | 202012003628 U1 | 7/2012 |
| FR | 3012568 A1 | 5/2015 |
| WO | 2013128574 A1 | 9/2013 |

OTHER PUBLICATIONS

Extended European Search Report, for European Patent Application No. 16175064.1, dated Nov. 18, 2016, 7 pages.

*Primary Examiner* — Alfred Wujciak
(74) *Attorney, Agent, or Firm* — Kinney & Lange, P.A.

(57) ABSTRACT

A mount for holding a display device includes a main support, a plurality of arms, and a locking assembly. The main support includes a front surface and a rear surface. The plurality of arms extends from a periphery of the main support. The main support and the plurality of arms are configured to retain the display device. The locking assembly is connected to the rear surface of the main support, and is configured to secure the display device. The locking assembly includes a locking arm and a locking mechanism. The locking arm is translatable relative to the main support, and is configured to support the display device in a secured position. The locking mechanism is connected to the locking arm. The locking mechanism includes a lever connected to the locking arm for releasing the locking mechanism.

18 Claims, 6 Drawing Sheets

(56) References Cited

U.S. PATENT DOCUMENTS

| | | | |
|---|---|---|---|
| 6,378,923 B1 | 4/2002 | Campbell | |
| 7,611,112 B2 * | 11/2009 | Lin | B60R 11/02 |
| | | | 248/274.1 |
| 7,823,844 B2 | 11/2010 | Carnevali | |
| 7,918,427 B2 * | 4/2011 | Wang | F16M 13/00 |
| | | | 248/278.1 |
| 8,066,241 B2 * | 11/2011 | Yu | F16M 11/04 |
| | | | 248/286.1 |
| 8,240,628 B2 * | 8/2012 | Huang | F16M 11/04 |
| | | | 248/122.1 |
| 8,905,367 B2 | 12/2014 | Bury | |
| 2010/0144404 A1 | 6/2010 | Cavani | |
| 2011/0101058 A1 | 5/2011 | Heckman | |
| 2011/0283879 A1 * | 11/2011 | Schwindaman | F15B 15/1438 |
| | | | 92/164 |
| 2012/0273630 A1 | 11/2012 | Gillespie-Brown et al. | |
| 2013/0104364 A1 | 5/2013 | Carnevali | |
| 2013/0277520 A1 | 10/2013 | Funk et al. | |
| 2013/0301216 A1 | 11/2013 | Trinh et al. | |
| 2014/0222254 A1 | 8/2014 | Ribich | |
| 2015/0282344 A1 * | 10/2015 | Ho | F16M 11/045 |
| | | | 248/125.7 |

* cited by examiner

MULTIPLE POSITION MOUNT WITH RETAINING MECHANISM

BACKGROUND

Electronic devices, such as laptop computers, notebook computers, and tablet computers can be used to run independent programs. These devices can also send and receive data through a network where programs can be run in another environment, such as a cloud. Data input and output to and from a program or cloud, or the visual interface for the program or cloud, can be displayed on the electronic devices. Electronic devices having these capabilities have become increasingly versatile and have been adapted for a wide variety of uses from school work to flight control. These devices often include a touch-sensitive display input integrated into the device screens, which accept touch gestures such as tapping, pinching, or sliding. Because of the user interface required to perform touch gestures, many of these electronic devices require mounts that retain the electronic devices in orientations that allow for their touch screen to be accessed.

In addition, electronic devices have become increasingly portable, due in part to advancements in battery and processor technologies. Because of the portability, and fragility that is inherent in many electronic devices, cases and mounts have been developed to mount, transport, and store electronic devices. In some applications, electronic devices can require cases and mounts that allow for visibility and access to their touch screen input while producing suitable protection for their surrounding environments and methods of use.

SUMMARY

In one embodiment, a mount for holding a display device includes a main support, a plurality of arms, and a locking assembly. The main support includes a front surface and a rear surface. The plurality of arms extends from a periphery of the main support. The main support and the plurality of arms are configured to retain the display device. The locking assembly is connected to the rear surface of the main support, and is configured to secure the display device. The locking assembly includes a locking arm and a locking mechanism. The locking arm is translatable relative to the main support, and is configured to support the display device in a secured position. The locking mechanism is connected to the locking arm. The locking mechanism includes a lever connected to the locking arm for releasing the locking mechanism. The locking mechanism prevents the locking arm from translating from the secured position.

In another embodiment, a mount system for mounting a display device includes a mount for holding a display device and a rotation device. The mount includes a main support, a plurality of arms, and a locking assembly. The main support includes a front surface and a rear surface. The plurality of arms extends from a periphery of the main support. The main support and the plurality of arms are configured to retain the display device. The locking assembly is connected to the rear surface of the main support, and is configured to secure the display device. The locking assembly includes a locking arm and a locking mechanism. The locking arm is translatable relative to the main support, and is configured to support the display device in a secured position. The locking mechanism is connected to the locking arm. The locking mechanism includes a lever connected to the locking arm for releasing the locking mechanism. The locking mechanism prevents the locking arm from translating from the secured position. The rotation device connected to the back plate.

DETAILED DESCRIPTION

Figure 1:
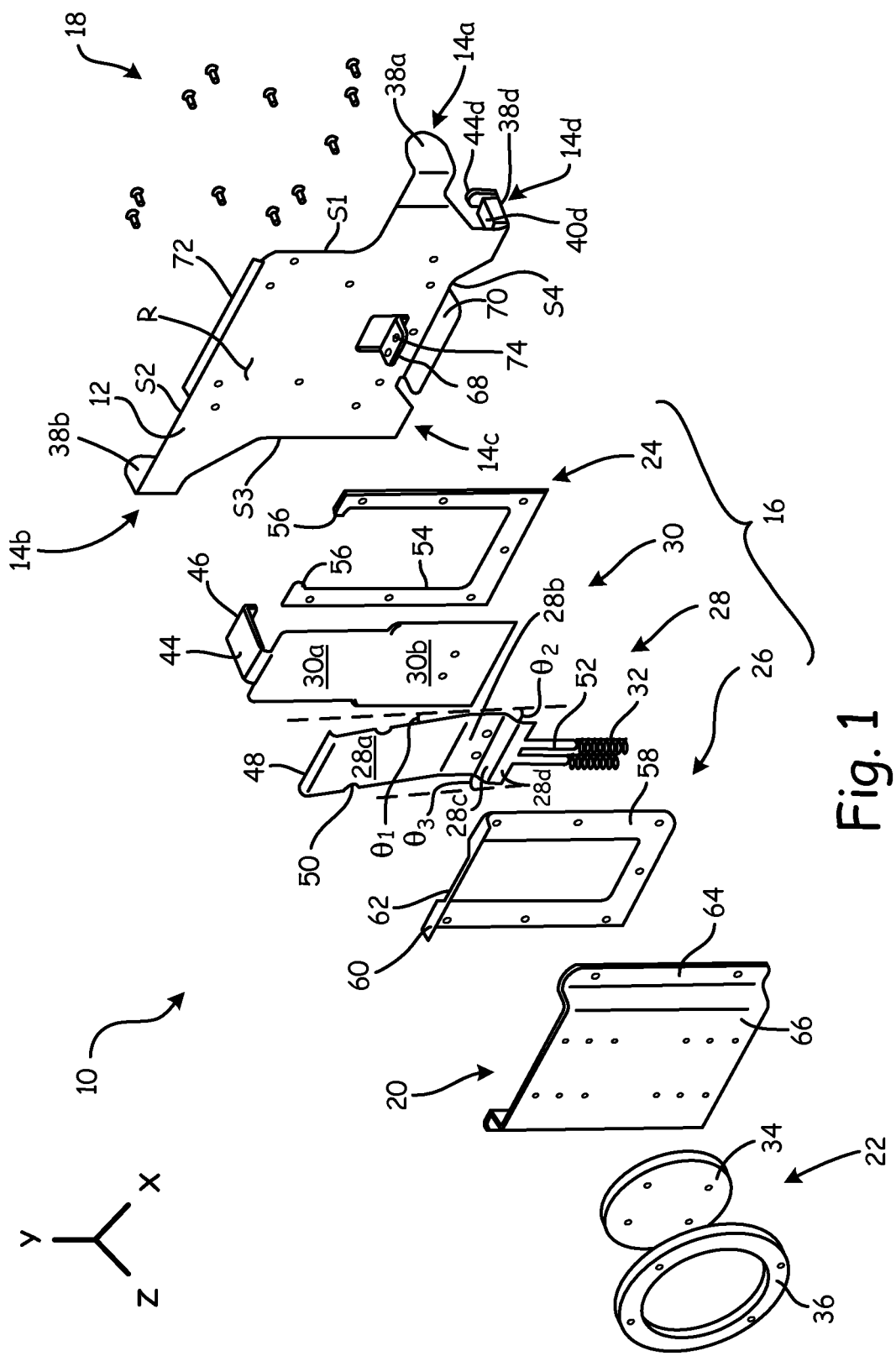
FIG. 1 is an exploded view of a display device mount.

FIG. 1 is an exploded view of display device mount 10, which includes main support 12 (which includes arms 14a-14d), locking assembly 16, fasteners 18, cover 20, and rotation mount 22. Locking assembly 16 includes locking arm guide 24, catch plate 26, lever 28, locking arm 30, and springs 32. Rotation mount 22 includes rotation insert 34 and rotation flange 36. Also shown in FIG. 1 are sides S1, S2, S3, and S4, and axes X, Y, and Z.

Main support 12 is substantially planar, apart from arms 14a-14d, and has several holes drilled therethrough, through which fasteners 18 can pass or to which fasteners 18 can attach. Arms 14a-14d are narrow, rigid, extensions of main support 12 that extend from the periphery of main support 12. Arm 14a extends from side S1; arm 14b extends from side S3; arms 14c and 14d extend from side S4.

Locking assembly 16 is connected to the rear surface of main support 12 by fasteners 18. Fasteners 18 attach catch plate 26 to rear surface R of main support 12 by passing through locking arm guide 24, which is disposed between (and connected to) catch plate 26 and rear surface R.

Lever 28 and locking arm 30 are connected with fasteners (not shown). Lever 28 bends away from locking arm 30. When connected to locking arm 30, lever 28 can move towards locking arm 30, but the movement of lever 28 away from locking arm 30 is constrained by catch plate 26. Also, lever 28 can move relative to catch plate 26 in the direction of the y-axis, but not the x-axis. Springs 32 are constrained by lever 28 and a portion of main support 12 (detailed below in the discussion of FIGS. 1, 2A, and 2B), and can apply a force to lever 28.

Locking arm 30 rests against main support 12 and extends past side S2. Locking arm 30 rests within and is coplanar with, but not connected to, locking arm guide 24. A portion of locking arm 30 breaks away from rear surface R toward front surface F, passing over main body 12.

Fasteners 18 can be screws, rivets, and the like. Fasteners 18 connect components of display device mount 10. In other embodiments, display device mount 10 can be assembled using another process such as through the use of locking tabs, or by welding.

In one embodiment, cover 20, which can also be a back plate, is attached to main support 12 with fasteners 18. Cover 20 covers and protects most of the components of locking assembly 16, such as portions of locking arm 30, portions of lever 28, catch plate 26, and locking arm guide 24.

In one embodiment, rotation flange 36 of rotation mount 22 is a substantially circular flange fastened to cover 20, which fixes the position of rotation flange 36 relative to cover 20 and main support 12. Rotation insert 34 is concentrically circular with rotation flange 36 and engages the inside diameter of rotation flange 36. Rotation insert 34 is able to rotate within and relative to rotation flange 36 and therefore relative to cover 20 and main support 12. Also, rotation insert 34 can mount to another fixed surface, for example to a surface in an aircraft cockpit, to a surface in a land-based vehicle, or any other mountable surface. In another embodiment, rotation flange 36 can be mounted to another fixed surface with rotation insert mounted to cover 20. The details of these embodiments are described below in greater detail.

In operation of one embodiment, a user can place an electronic device into display device mount 10. A user can then apply a force on locking arm 30, causing lever 28 to lockingly engage catch plate 26, which functions as a locking mechanism that locks the position of lever 28 and therefore locking arm 30. This causes arms 14a-14d, in conjunction with locking arm 30, to fully secure the electronic device within display device mount 10.

A user can then release locking assembly 16 by actuating lever 28 towards locking arm 30, enabling removal of the electronic device from display device mount 10. This toolless operation of lever 28 (and locking assembly 26), allows a user to quickly and easily remove an electronic device from display device mount 10, in some cases, with a single hand or appendage. Because the device can be removed without a tool, the electronic device can be placed in a class of devices that require less testing and certification.

Figure 2A:
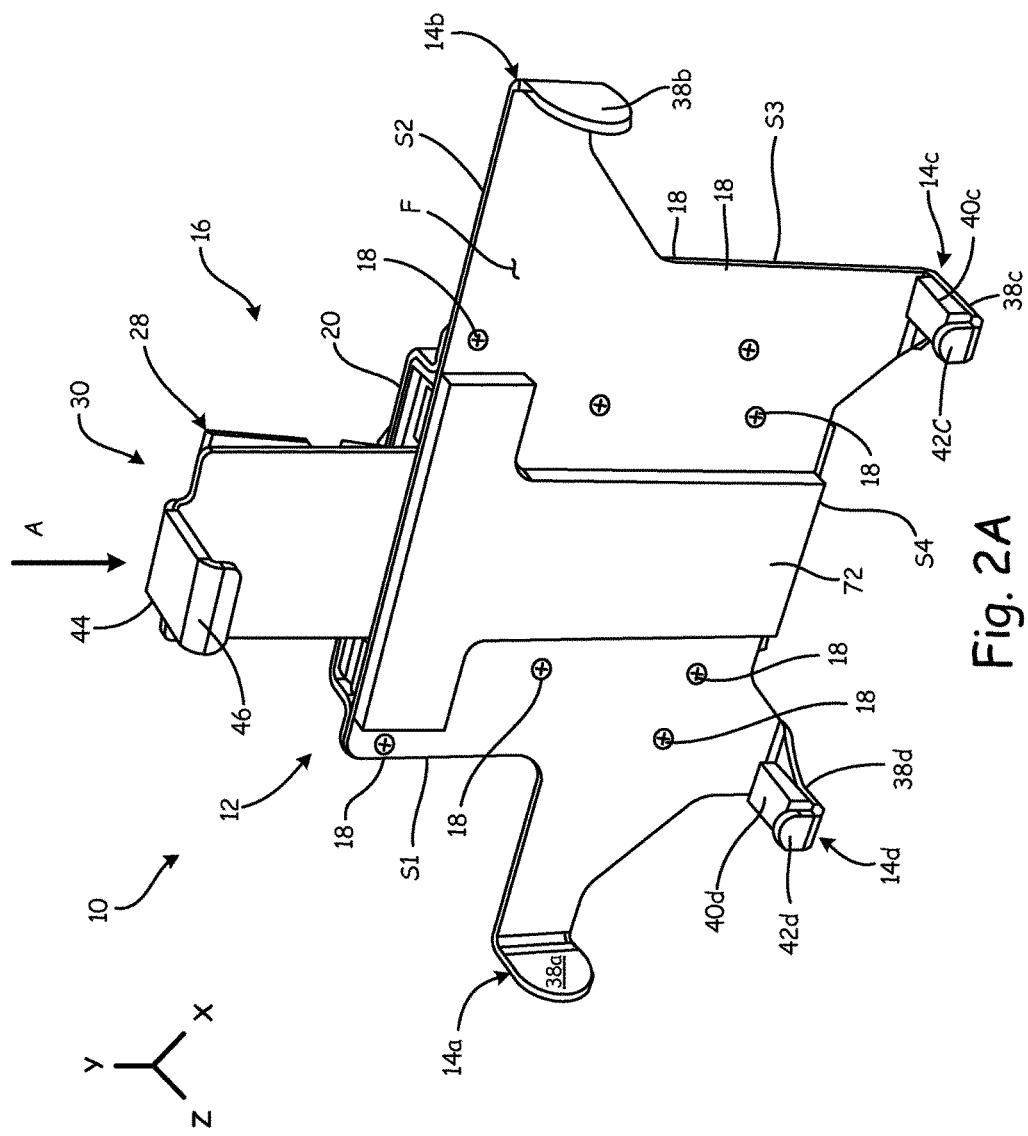
FIG. 2A is a front isometric view of the display device mount of FIG. 1.
Figure 2B:
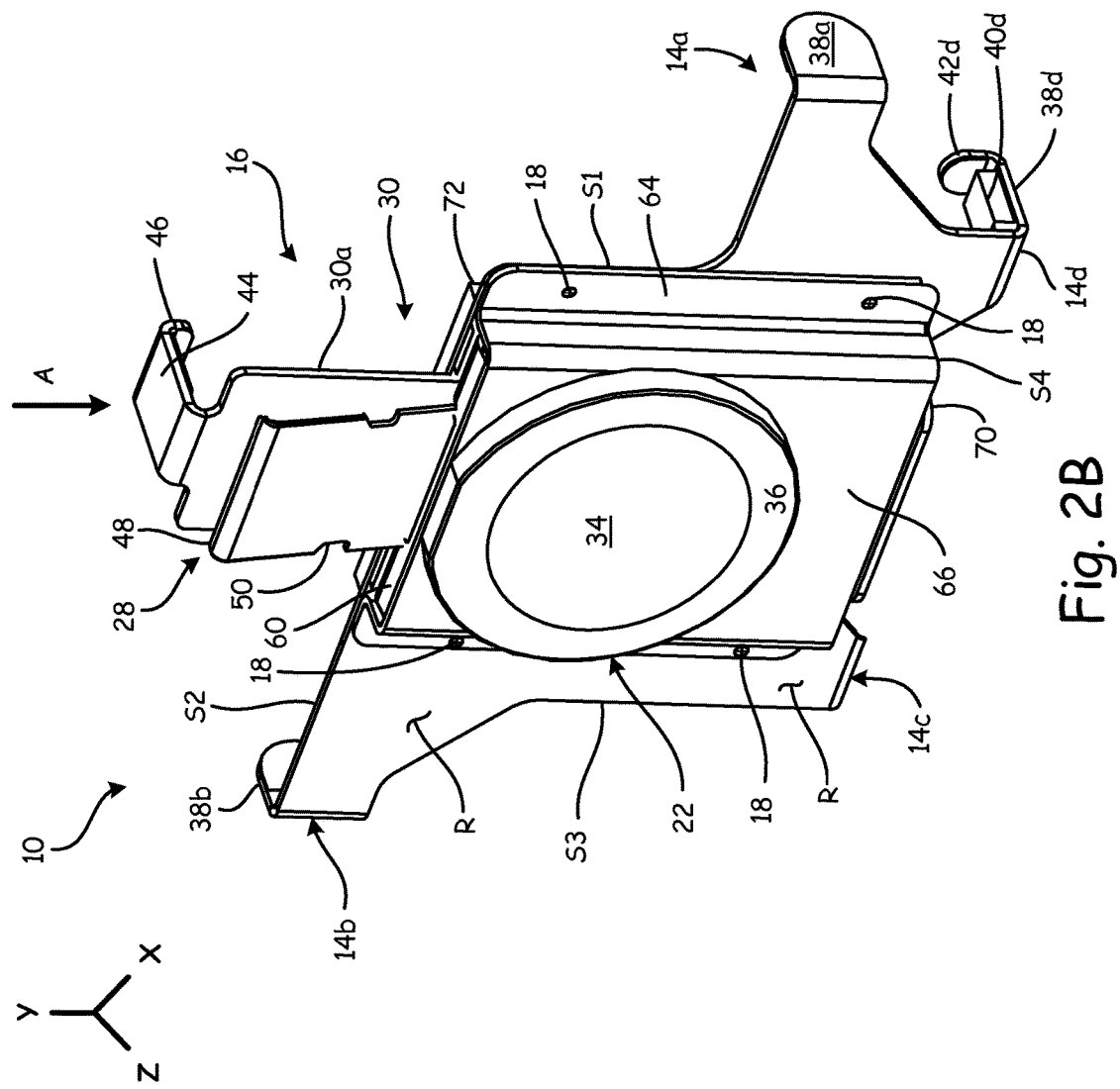
FIG. 2B is a rear isometric view of the display device mount of FIG. 1.

FIG. 2A is a front isometric view of display device mount 10. FIG. 2B is a rear isometric view of display device mount 10. FIGS. 1, 2A, and 2B are discussed concurrently.

Arms 14a-14c, of main support 12, include arm extensions 38a-38d (shown in FIG. 2A). Arms 14c and 14d also include arm extension pads 40c and 40d, respectively, and arm retainers 42c and 42d, respectively.

Locking arm 30 includes locking arm portions 30a and 30b, locking arm extension 44, and locking arm retainer 46. Lever 28 includes lever portions 28a-28d (shown in FIG. 1), respectively. Lever 28 also includes lever stop 48, lever notches 50, and spring retainer bars 52 (all shown in FIG. 1). Locking arm guide 24 includes guide perimeter 54 and locking arm stops 56 (shown in FIG. 1). Catch plate 26 includes catch mount 58, latching portion 60, and latching features 62 (all shown in FIG. 1).

Cover 20 includes cover flange 64 and cover surface 66 (shown in FIGS. 1 and 2B). Main support 12 also includes retainer guide 68 (shown in FIG. 1), retainer bar cover 70 (shown in FIG. 1), and main support pad 72 (shown in FIG. 2A). Retainer guide 68 includes bar guide slots 74 (shown in FIG. 1). Main support 12 also includes front surface F (shown in FIG. 2A) and rear surface R (shown in FIG. 2B). Also shown in FIGS. 1, 2A and 2B are sides S1, S2, S3, and S4, angles $\theta_1$, $\theta_2$, and $\theta_3$, and axes X, Y, and Z. Also shown in FIGS. 2A and 2B is force A.

Arms 14a-14d are substantially coplanar with main support 12 prior to their respective transitions to arm extensions 38a-38d (shown in FIG. 2B). In one embodiment, arms 14a-14d break from their coplanar portions, extending perpendicularly from main support 12, and becoming arm extensions 38a-38d. Arm extensions 38a-38d form an angle of approximately 90 degrees with main support 12, and can form other angles with main support 12 in other embodiments. Arm retainers 42c and 42d break from arm extensions 38c and 38d, respectively, to become perpendicular to arm extensions 38c and 38d, respectively, and parallel to main support 12. Arm retainers 42c and 42d have a rounded termination, as do arm extensions 38a and 38b.

Arm extension pads 40c and 40d (shown in FIG. 2A) are connected to arm extensions 38c and 38d, respectively, using an adhesive, for example. Similarly, main support pad 72 (shown in FIG. 2A) is connected to front surface F of main support 12, for example, using an adhesive. Though not shown, in other embodiments, arm extensions 38a-38b and locking arm extension 44 can also have support pads.

Retainer guide 68 (shown in FIG. 1) breaks from rear surface R of main support 12 between the center of main support 12 and side S4, and is perpendicular to main support 12. Retainer bar cover 70 (shown in FIG. 1) also breaks from rear surface R of main support 12, but does so at side S4. Retainer bar cover 70 and retainer guide 68 are substantially parallel. Retainer guide 68 has bar guide slots 74 (shown in FIG. 1), through which spring retainer bars 52 translate.

Locking assembly 16 is connected to the rear surface of main support 12 by fasteners 18 (as shown in FIG. 2B). Fasteners 18 attach catch mount 58 (shown in FIG. 1), of catch plate 26, to rear surface R of main support 12 by passing through locking arm guide 24. Arm guide 24 (shown in FIG. 1) is disposed between (and connected to) catch mount 58 and rear surface R. Catch mount 58, locking arm guide 24, locking arm portions 30a and 30b (shown in FIG. 1) and rear surface R of main support 12 are all substantially parallel; however, none of these components are coplanar with main support 12. Locking arm portions 30a and 30b (shown in FIG. 1) rest against main support 12 and extend past side S2, opposite arms 14c and 14d.

Extending from catch mount 58 is latching portion 60. Latching portion 60 (shown in FIG. 1) breaks from catch mount 58 near side S2, away from rear surface R (in the z-axis).

Locking arm portions 30a and 30b rest within and are coplanar with, but are not connected to, locking arm guide 24. Locking arm extension 44 breaks from locking arm portion 30a, becoming perpendicular with main support 12 and locking arm portion 30a. Locking arm retainer 46 breaks from locking arm extension 44 to become parallel with locking arm portion 30a and perpendicular to locking arm extension 44, terminating shortly thereafter in a rounded termination.

Lever 28 and locking arm 30 are connected with fasteners (not shown) at lever portion 28b and locking arm portion 30b (shown in FIG. 1). Lever portion 28b is parallel to locking arm portions 30a and 30b, and therefore main support 12. However, lever portion 28a bends away from locking arm portions 30a and 30b, at an angle $\theta_1$ (shown in FIG. 1) of approximately 10 degrees. When connected to locking arm portions 30a and 30b, lever portion 28a can move towards locking arm portions 30a and 30b until lever stop 48 (shown in FIG. 1) contacts locking arm portion 30a, at an angle $\theta_1$ of approximately 1 degree.

Lever portion 28c also breaks from lever portion 28b, but at angle $\theta_2$ (shown in FIG. 1). Further, lever portion 28d breaks from lever portion 28c at angle $\theta_3$ (shown in FIG. 1). Connected to lever portion 28d are spring retainer bars 52 (shown in FIG. 1), around which springs 32 are disposed. When locking assembly 16 is attached to main support 12, springs 32 are disposed between lever portion 28d and retainer guide 68. Retainer guide 68 restricts the movement of springs 32 in the Y axis. Spring retainer bars 52 retain springs 32 and restrict their movement in the X and Z axes. Together, lever portion 28d, retainer guide 68, and spring retainer bars limit the movement of springs in the Y axes, but only in compression and expansion, as springs 32 are not free to move between lever portion 28d and retainer guide 68.

In one embodiment spring retainer bars 52 and lever portions 28a-28d are comprised of a single piece of material. However, in other embodiments, spring retainer bars 52 and lever portions 28a-28d can be comprised of multiple pieces and fastened together.

Angles $\theta_2$ and $\theta_3$ along with the lengths of lever portions 28c and 28d are designed so that spring retainer bars 52 become parallel with lever 28b and main support 12. This design also places spring retainer bars 52 at a distance offset from rear surface R such that spring retainer bars 52 align with bar guide slots 74. Further, retainer guide 68 and spring retainer bar cover 70 are spaced so that the travel of spring retainer bars 52 is not limited, allowing the translation of lever 28 and locking arm 30 in the x-axis to be limited by guide surface 54 of locking arm guide 24. In some embodiments, retainer bar cover 70 can limit the travel of spring retainer bars 52 and therefore lever 28 and locking arm 30.

Cover flange 64 of cover 20 is attached to rear surface R of main support 12 by fasteners 18 (shown in FIG. 2B). Disposed between cover 20 and main support 12 are portions of locking arm 28, and portions of lever 28. Connected to cover surface 66 of cover 20 is rotation mount 38, which is mounted substantially in parallel with cover 20 and main support 12. In one embodiment, rotation flange 36 is a substantially circular flange fastened to cover 20, which fixes the position of rotation flange 36 relative to cover 20 and main support 12.

When locking assembly 16 is attached to main support 12, the movement of many of the components of locking assembly 16 is restricted. Locking arm 30 can translate along the y axis, but its motion in the x axis is substantially prevented by inner surface 54 of locking arm guide 24. Also, stops 56, together with inner surface 54, limit the y-axis translation of locking arm 30, as stops 56 contact the transition between locking arm portions 30a and 30b. Essentially, the movement of locking arm 30 is limited to the difference between the y-axis lengths of inner surface 54 and locking arm portion 30b. Similarly, the inside surface of catch plate 26 substantially prevents movement of lever 28 in the x-axis. Latch features 62 can engage notches 50 to limit the motion of lever 28 in the y-axis, which can limit the motion of locking arm 30 beyond its above-described limitations imposed by locking arm guide 24.

Movement of lever portion 28a away from locking arm 30 is possible, but is restricted by catch plate 26. Also, as discussed above, the movement of lever portion 28a towards locking arm portions 30a and 30b is limited by contact between lever stop 48 and locking arm portion 30a.

In operation of one embodiment, a user can place an electronic device into display device mount 10. A user can then apply force A on locking arm 30, causing lever 28 to lockingly engage latching features 62, which function as a locking mechanism that locks the position of lever 28 and therefore locking arm 30. This causes arms 14a-14d, in conjunction with locking arm 30, to fully secure the electronic device within display device mount 10, as described above. The details of this operation are described in greater detail below.

Figure 3A:
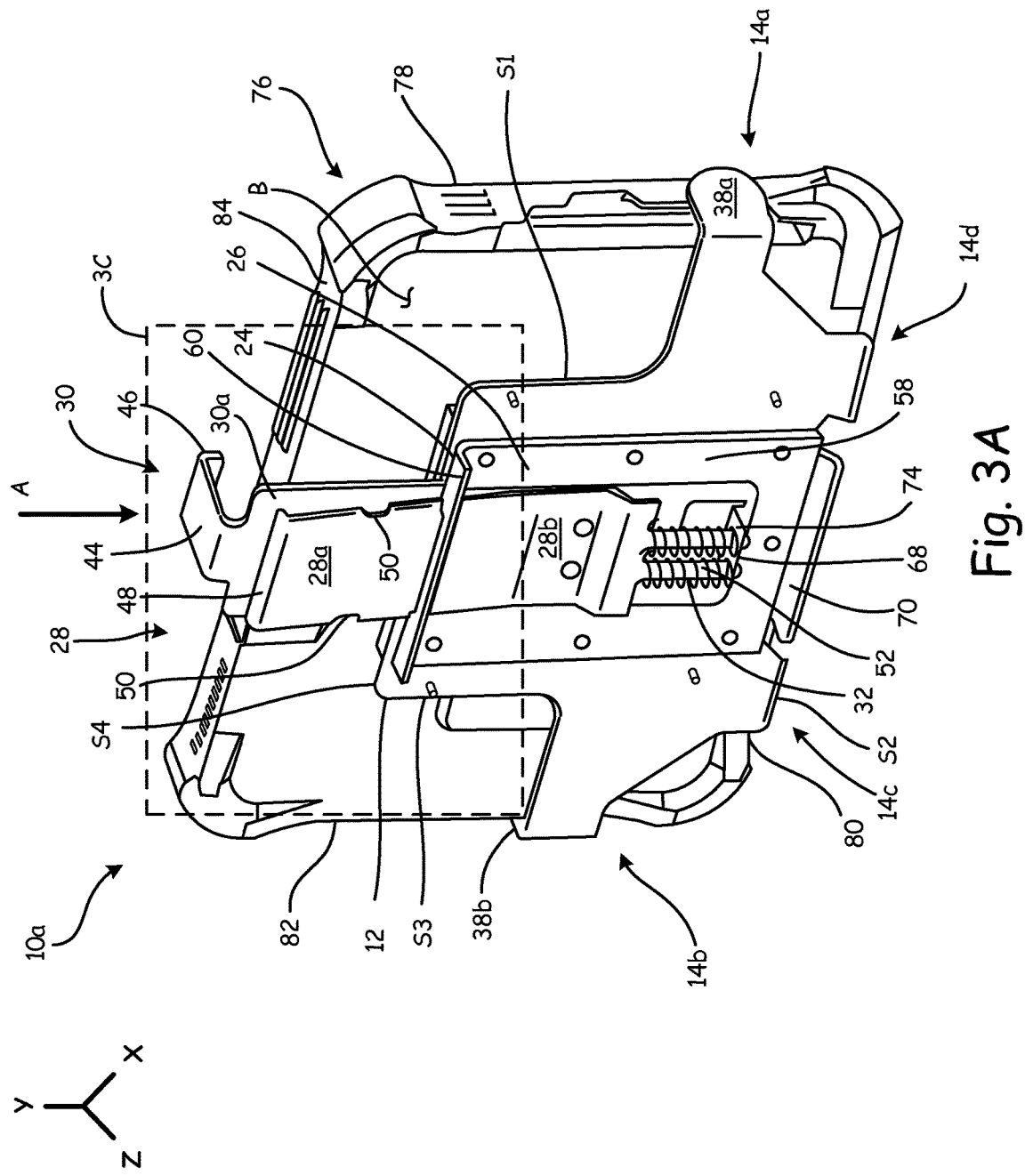
FIG. 3A is a rear isometric view of the display device mount of FIGS. 1, 2A, and 2B, showing a lever in a first position and a locking arm in an open position.
Figure 3B:
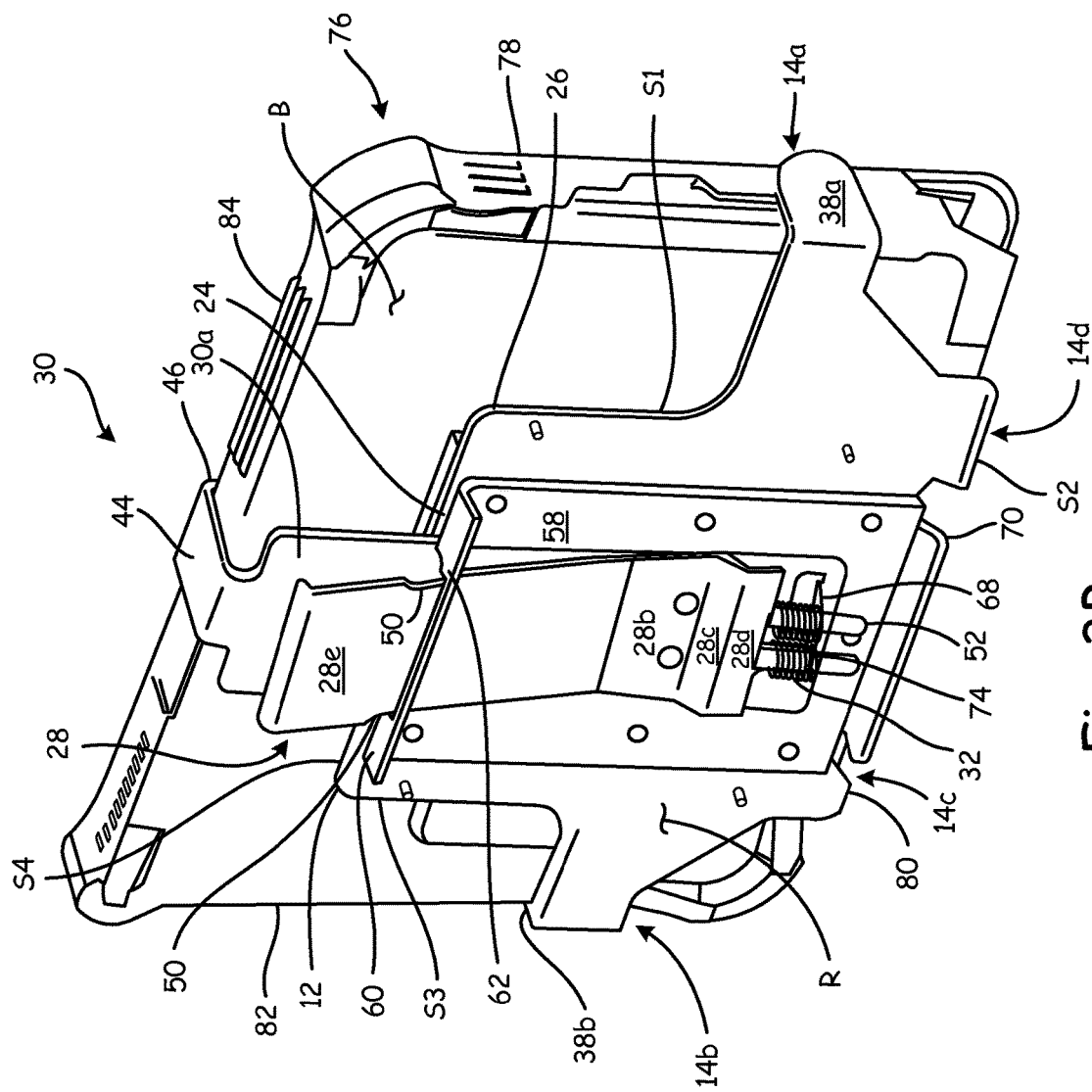
FIG. 3B is an isometric view of the display device mount of FIGS. 1, 2A, and 2B, showing the lever in a second position and the locking arm in a secure position.
Figure 3C:
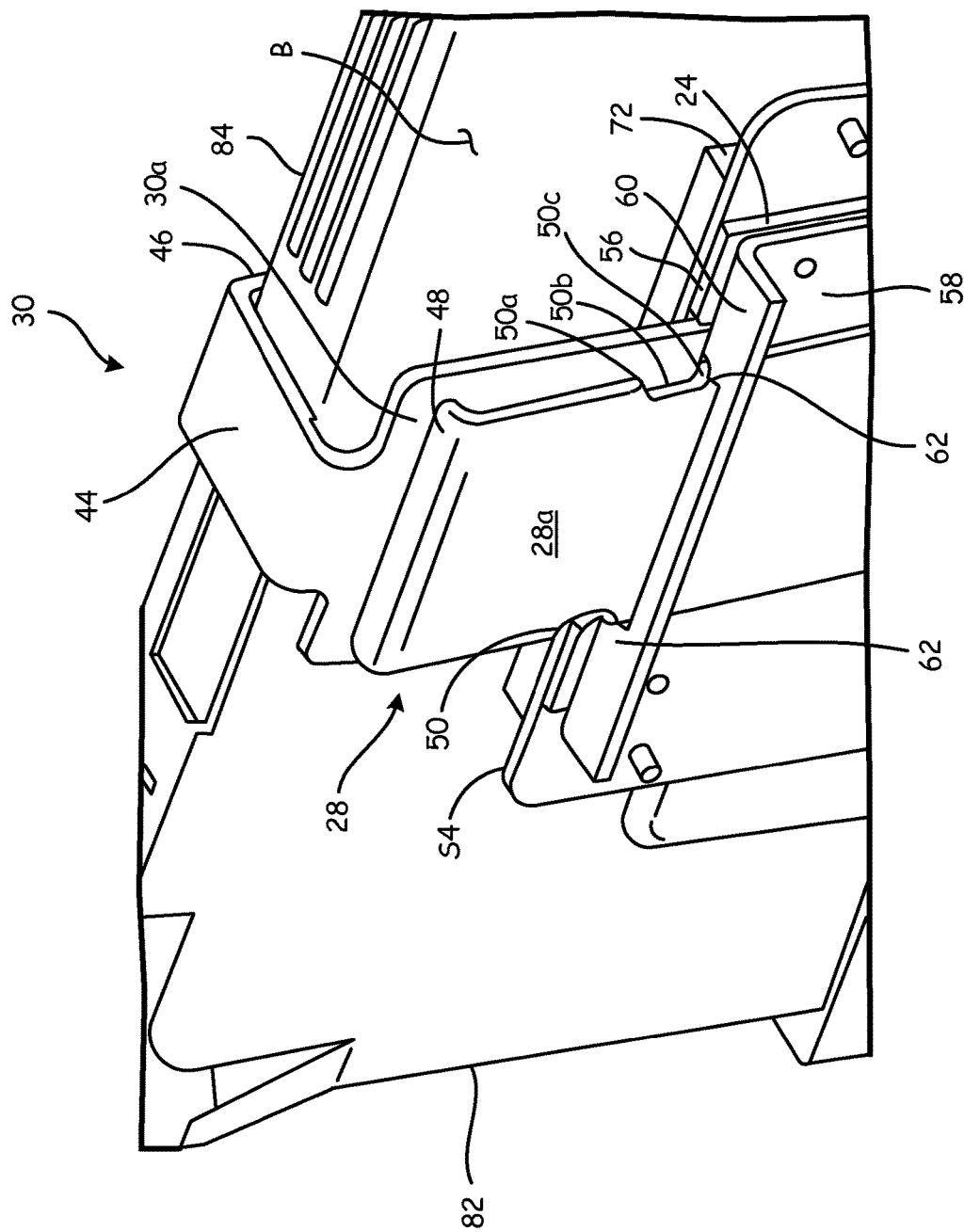
FIG. 3C is an isometric view of the display device mount of FIGS. 1A, 2A, and 2B, showing the lever in a third position and the locking arm in the secure position.

FIGS. 3A-3C show display device mount 10a, which is another embodiment of display device mount 10 of FIGS. 1, 2A, and 2B. Display device mount 10a primarily differs in that arms 14a and 14b are arranged differently than in display device mount 10.

FIG. 3A is a rear isometric view of another embodiment of a display device mount of FIGS. 1, 2A and 2B showing lever 28 in a first position and locking arm 30 in an open position. FIG. 3B shows lever 28 in a second position and locking arm 30 in a secure position. FIG. 3C is an enlarged view of device mount 10a, showing lever 28 in a third position and locking arm 30 in a secure position. FIGS. 3A-3C are discussed concurrently.

Elements of FIGS. 3A-3C that are the same as elements of FIGS. 1, 2A and 2B are identified by the same character reference numbers. Cover 20 is removed in FIGS. 3A-3C for better illustration of the components of locking assembly 16. The components of display device mount 10a connect and operate consistently with FIGS. 1, 2A and 2B; however, in FIGS. 3A-3C arms 14a and 14b are symmetrical relative to main support 12. This shows that the placement of arms 14a-14d can be varied to secure many electronic devices.

Catch plate 26 includes catch mount 58, latching portion 60, and latching features 62. Notches include notch surfaces 50a, 50b, and 50c (shown in FIG. 3C).

Main support 12 also includes retainer guide 68, and retainer bar cover 70. Retainer guide 68 includes bar guide slots 74. Main support 12 also includes front surface F and rear surface R. Also shown in FIGS. 3A-3C is electronic device 76, which includes back surface B and sides 78, 80, 82, and 84. Also shown in FIG. 3A-3C are sides S1, S2, S3, and S4, axes X, Y, and Z, and force A.

Notches 50 each have notch surfaces 50a, 50b, and 50c. Notch surfaces 50a and 50b are substantially parallel with sides S2 and S4. Notch surface 50c is perpendicular to notch surfaces 50a and 50b. At notch surfaces 50c, the width of lever 28 (dimension in x-axis) is narrower than the rest of the width of lever 28.

In operation of one embodiment, electronic device 76 can be inserted into display device mount 10a when locking arm 30 is in an open position. Electronic device 76 can be inserted so that back surface B contacts mounting pad 25, and a front surface of electronic device 76 will contact arm retainers 42c and 42d, respectively, which will partially constrain the movement of electronic device 76 in the Z axis. Sides 78 and 82 of electronic device 76 will contact arm extensions 38a and 38b, respectively, which constrain the movement of the electronic device in the X axis. Side 80 of electronic device 76 will further contact arm extension pads 40c and 40d, which partially restrict the movement of the electronic device in the Y axis.

In an open position, as shown in FIG. 3A, lever 28 will form angle $\theta_1$ of about less than six degrees, as the freedom of lever 28 is restricted by latching portion 60 of catch plate 26. However, lever 28 is bent to angle $\theta_1$ of 10 degrees, meaning lever 28 is biased to movement away from locking arm 30.

Then, a user can apply force A to locking arm 30, causing locking arm 30 to translate in the direction of the y-axis towards side 84. When moving, lever 28 will slide along the surface of latching features 62, because the bias of lever 28 causes contact between lever 28 and latching features 62. When locking arm 30 is translated towards side S2, lever 28 will begin to compress springs 32 between lever portion 28d and retainer guide 68, as retainer bars 52 translate through bar guide slots 74 of retainer guide 68. Springs 32 will apply a reaction force to lever 28 and therefore locking arm 30 in a direction opposed to force A, biasing locking arm 30 towards an open position. Locking arm 30 will only continue to move towards side S2 if force A is greater than the opposing force applied to locking arm 30 by springs 32.

When locking arm 30 has translated far enough, notches 50 will clear latching features 62, which are designed to have an opening along the x-axis that is larger than the width between notch surfaces 50c, but smaller than the width of lever 28. As notches 50 clear latching features 62, lever 28 can flex away from locking arm 30, because of the bias on lever 28 caused by the bend in lever 28 at angle $\theta_1$. Lever 28 will flex to a second position, as shown in FIG. 2B. When lever 28 moves to the second position, between latching features 62, angle $\theta_1$ will be approximately 6 degrees. If force A is still applied, notch surfaces 50a will impact latching features 62, preventing lever 28 from further translating towards side S2. This impact can be sensed by a user through a felt vibration and by the sound produced by the impact between notch surfaces 50a and latching features 62. If force A is eliminated, springs 32 will apply a force on lever 28 substantially in the Y-axis towards side S4, translating lever 28 back towards an open position. However, lever 28 will not translate much, as notch surfaces 50b will engage latching features 62. With notches 50 engaging latching features 62, lever 28, locking arm 30, and therefore electronic device 76 have very little freedom to move. In one embodiment, extension pads 28b and 28d can be compressed when notch surfaces 50b are engaged with latching features 62, further restricting the freedom of electronic device 76.

Alternatively, a user can depress lever 28 towards locking arm 30, apply force A, index notches 50 to latching features 62 and release lever 28 when notch surfaces 50b are engaged with latching features 62. This method can reduce friction and impact on lever 28 and catch plate 26. Other methods for locking lever 28 can also be used.

With locking arm 30 in a secured position, locking arm extension 44 contacts electronic device 76, which, together with arm extension pads 40c and 40d, substantially constrain the movement of the electronic device in the Y axis. Also, locking arm retainer 46 will engage electronic device 76, and together with arm retainers 42c and 42d, will substantially constrain the movement of the electronic device in the Z axis. While locking arm 30 is lockingly engaged, the electronic device is substantially secured and prevented from movement in any direction relative to display device mount 10a. Because the locking arm requires a force in a single direction, an electronic device can be quickly secured in display device mount 10a without a tool, and, in some cases, with a single hand or other appendage, such as a finger.

With electronic device 76 secured into display device mount 10a, and with rotation insert 34 attached to another surface. A user can rotate display device mount 10a relative to rotation insert 34 and the surface to which rotation insert 34 is attached. This allows a user to change between landscape and portrait orientation of electronic device 76 without un-securing electronic device 76.

When desired, a user can release locking assembly 16 by actuating lever 28 towards locking arm 30. Preferably a user will first apply force A prior to actuating lever 28 to reduce friction and wear. As shown in FIG. 3C, lever stop 48 limits the actuation of lever 28 towards arm 30 to an angle $\theta_1$ of 1 degree, allowing a user to quickly index lever 28 to a degree of angle $\theta_1$ low enough to release notches 50 from latching features 62, while preventing unnecessary reduction of angle $\theta_1$. This increases the longevity of lever 28. In other embodiments, lever 28 does not have a lever stop. Further, lever 28 can be designed to have a modulus of elasticity that results in stresses of lever 28 during operation that are lower than (or far lower than) the elastic limit (or yield strength) of the materials of lever 28. This can increase the longevity of lever 28.

When lever 28 is actuated to angle $\theta_1$ of 2 degrees or less, angle $\theta_1$ is low enough to release notches 50 from latching features 62. There will then be no force opposing the force applied by springs 32, which will cause lever 28 to travel in the positive direction of the y-axis, towards side S2. Because lever 28 and locking arm 30 are connected, locking arm will move in the same direction, until locking arm stops 56 stop the motion of locking arm 30. At this point, locking arm 30 will be in an open position, allowing electronic device 76 to be easily removed from display device mount 10a. If locking is again desired, a user can re-lock display device mount 10a by re-applying force A to locking arm 30.

In one embodiment, latching portion 60 is perpendicular to lever 28 when lever 28 is at angle $\theta_1$ of 6 degrees, or when lever 28 is in a locked position. This provides a better contact surface area between latching features 62 and notches 50, which reduces wear of these components. In other embodiments, latching portion 60 can be at other angles relative to lever 28 or to catch mount 58.

Retainer bar cover 70, together with cover 20 protect the components of locking assembly 16, and protect a user from the moving components of locking assembly 16.

Locking arm 30 and locking arm guide 24 can comprised of a rigid material, such as aluminum, steel, titanium, or high density polyethylene, and the like. In one embodiment, locking arm 30 and locking arm guide 24 can be comprised of anodized aluminum with polytetrafluoroethylene impregnated into the aluminum. This reduces friction between locking arm 30 and locking arm guide 24. Reducing friction has several benefits such as prolonging the life locking arm 30 and locking arm guide 24, reducing the amount of force required to lock lever 28, and reducing the amount of force that springs 32 must produce to open locking arm 30, which reduces the cost of springs 32.

Main support 12, cover 20, locking arm 30, lever 28, locking arm guide 24, and catch plate 26 are comprised of a rigid material, such as aluminum, steel, titanium, high density polyethylene, and the like. The use of these materials can provide a rugged, robust mount that is capable of withstanding the environment of aerospace applications, which can include high temperature and pressure fluctuations, and exposure to ultra violet light and vibrations.

Extension pads 40c and 40d are relatively soft, and have substantially nonabrasive contact surfaces, which help prevent damage to electronic device 76, caused by contact between display device mount 10 and the electronic device. Extension pads 40c and 40d can be comprised of closed cell foam or rubber, such as ethylene propylene diene monomer (EPDM). Also, because extension pads 40c and 40d are compressible, they can help compensate for manufacturing tolerance stacking that may occur in an assembly of parts, or a manufactured piece with multiple cuts and breaks, like main support 12. Main support pad 72 can made from similar materials, having similar characteristics, and providing similar benefits.

Also, display device mount 10a can be made from a metal having a non-reflective surface, such as a brushed or matte finish. This is desirable in the cockpit of an aircraft, where vision can be critical.

Though main support 12 and arms 14a-14d are shown as being configured to retain a substantially rectangular electronic device, main support 12 and arms 14a-14d can be configured to retain a device of any geometric shape. Similarly, pad 72 can be optimized in shape and material to accept different electronic devices.

In one embodiment, arms 14a-14d are shown in specific location to optimize a user's access to the features of the pictured electronic device. However, in other embodiments, arms 14a-14d can be located in other locations to optimize a user's access to the features of another electronic device, or to optimize for another purpose, such as weight reduction, or restraint of the electronic device.

Arms 14a-14d together with main support 12 can be formed of a single piece and partially shaped in a punch, stamp, laser cutting, or water jet process. Arms 14a-14d can also be made of individual pieces and assembled through a fastening method such as riveting, welding, screwing, and the like.

Though angles $\theta_1$, $\theta_2$, and $\theta_3$ have been described as having specific values. Other values can be used for angles $\theta_1$, $\theta_2$, and $\theta_3$ to optimize performance or design for a particular device, method of use, or operating environment.

As discussed above, the present disclosure provides several benefits. Tool-less operation of locking assembly 26, allows fast and simple removal of an electronic device from display device mount 10. The process can be performed, in some cases, with a single hand or appendage. Because an electronic device can be removed without a tool, the electronic device can be placed in a class of devices for use on an aircraft that requires less testing and certification.

In one embodiment, a majority of the components of display device mount 10 are comprised of relatively thin metal. This keeps manufacturing costs low, and also helps to reduce the size of display device mount 10 in the Z axis, where components are stacked upon each other. Maintaining a small Z dimension helps to keep a display device close to the surface to which display device mount 10 is secured. This can save space in a confined area, for example in a car or the cockpit of an aircraft.

Also, by using anodized aluminum with polytetrafluoroethylene impregnated into the aluminum for locking arm 30 and locking arm guide 24, friction between locking arm 30 and locking arm guide 24 is reduced. Reducing friction has several benefits such as prolonging the life locking arm 30 and locking arm guide 24, reducing the amount of force required to lock lever 28, and reducing the amount of force that springs 32 must produce to open locking arm 30, which reduces the cost of springs 32.

Because latching portion 60 is designed to be perpendicular to lever 28 when lever 28 is at angle $\theta_1$ of 6 degrees, or when lever 28 is in a locked position, provides a better contact surface area between latching features 62 and notches 50, which reduces wear of these components.

The design of lever 28 has several benefits. Lever stop 48 limits the actuation of lever 28 towards arm 30, which allow for quick indexing of lever 28 to a degree of angle $\theta_1$ low enough to release notches 50 from latching features 62. This simultaneously prevents unnecessary reduction of angle $\theta_1$, prolonging the longevity of lever 28. Also, by designing lever 28 to have a modulus of elasticity that results in stresses of lever 28 during operation that are lower than (or far lower than) the elastic limit (or yield strength) of the materials of lever 28, the longevity of lever 28, and display device mount 10 is increased. Further, breaking lever 28 to form lever portions 28c and 28d allows for the alignment of spring retainer bars 52 with retainer guide 68. This design allows for spring retainer bars 52 to be incorporated into lever 28 as a single piece, reducing the complexity and cost of display device mount 10.

Discussion of Possible Embodiments

The following are non-exclusive descriptions of possible embodiments of the present invention.

A mount for holding a display device includes a main support, a plurality of arms, and a locking assembly. The main support includes a front surface and a rear surface. The plurality of arms extends from a periphery of the main support. The main support and the plurality of arms are configured to retain the display device. The locking assembly is connected to the rear surface of the main support, and is configured to secure the display device. The locking assembly includes a locking arm and a locking mechanism. The locking arm is translatable relative to the main support, and is configured to support the display device in a secured position. The locking mechanism is connected to the locking arm. The locking mechanism includes a lever connected to the locking arm for releasing the locking mechanism. The locking mechanism prevents the locking arm from translating from the secured position.

The mount of the preceding paragraph can optionally include, additionally and/or alternatively, any one or more of the following features, configurations and/or additional components.

The locking can include further comprises a spring that applies a force on the lever, and the lever can include a first end that can be actuatable to release the locking mechanism and a spring retainer that can be connected to a second end of the lever.

The lever and spring retainer can be formed of a single piece of material.

The locking mechanism can comprise a catch plate that does not engage the lever when the lever is in a first position, and can lockingly engage the lever when the lever is in a second position.

The locking arm can be in the secured position when the lever is in the second position.

The catch plate can include a latching feature to engage notches of the lever in the second position.

The lever can include a first bend that causes the lever to be biased to the second position.

The catch plate can be perpendicular to the lever when the lever is in the second position.

The locking assembly can include a retainer guide connected to the main support that allows the spring retainer to move through the spring retainer guide in substantially one plane.

The lever can include a second bend to align the spring retainer with the spring retainer guide.

The spring can apply a force on the retainer guide and the lever, biasing the locking arm to an open position.

The locking assembly can include a locking arm guide connected to the rear surface that defines a movable path for the locking arm.

The locking arm guide and the locking arm can be comprised of polytetrafluoroethylene impregnated in anodized aluminum.

The lever can include a third bend towards the locking arm that indexes the lever to the first position.

In another embodiment, a mount system for mounting a display device includes a mount for holding a display device and a rotation device. The mount includes a main support, a plurality of arms, and a locking assembly. The main support includes a front surface and a rear surface. The plurality of arms extends from a periphery of the main support. The main support and the plurality of arms are configured to retain the display device. The locking assembly is connected to the rear surface of the main support, and is configured to secure the display device. The locking assembly includes a locking arm and a locking mechanism. The locking arm is translatable relative to the main support, and is configured to support the display device in a secured position. The locking mechanism is connected to the locking arm. The locking mechanism includes a lever connected to the locking arm for releasing the locking mechanism. The locking mechanism prevents the locking arm from translating from the secured position. The rotation device connected to the back plate.

The system of the preceding paragraph can optionally include, additionally and/or alternatively, any one or more of the following features, configurations and/or additional components.

The locking can include further comprises a spring that applies a force on the lever, and the lever can include a first end that can be actuatable to release the locking mechanism and a spring retainer that can be connected to a second end of the lever.

The catch plate can include a latching feature to engage notches of the lever in the second position.

The locking mechanism can include a catch plate that does not engage the lever when the lever is in a first position, and the catch plate can engage and lock the lever when the lever is in a second position.

The catch plate can include a catch to engage notches of the lever in the second position The locking assembly can include a locking arm guide connected to the rear surface that can define a movable path for the locking arm.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A mount for holding a display device, the mount comprising:
   a main support comprising a front surface and a rear surface;
   a plurality of arms extending from a periphery of the main support, wherein the main support and the plurality of arms are configured to retain the display device; and
   a locking assembly connected to the rear surface of the main support, wherein the locking assembly is configured to secure the display device, the locking assembly comprising:
      a locking arm translatable relative to the main support, wherein the locking arm is configured to support the display device in a secured position; and
      a locking mechanism connected to the locking arm comprising:
         a lever connected to the locking arm for releasing the locking mechanism, wherein the locking mechanism prevents the locking arm from translating from the secured position, the lever comprising a first end that is actuatable to release the locking mechanism and a spring retainer connected to a second end of the lever; and
         a spring that applies force on the lever.

2. The mount of claim 1, wherein the lever and spring retainer are formed of a single piece of material.

3. The mount of claim 1, wherein the locking mechanism comprises a catch plate that does not engage the lever when the lever is in a first position, and lockingly engages the lever when the lever is in a second position.

4. The mount of claim 3, wherein the locking arm is in the secured position when the lever is in the second position.

5. The mount of claim 3, wherein the catch plate includes a latching feature to engage notches of the lever in the second position.

6. The mount of claim 5, wherein the lever includes a first bend that causes the lever to be biased to the second position.

7. The mount of claim 3, wherein the catch plate is perpendicular to the lever when the lever is in the second position.

8. The mount of claim 1, wherein the locking assembly further comprises a retainer guide connected to the main support that allows the spring retainer to move through the spring retainer guide in substantially one plane.

9. The mount of claim 8, wherein the lever includes a second bend to align the spring retainer with the spring retainer guide.

10. The mount of claim 8, wherein the spring applies a force on the retainer guide and the lever biasing the locking arm to an open position.

11. The mount of claim 1, wherein the locking assembly further comprises a locking arm guide connected to the rear surface that defines a movable path for the locking arm.

12. The mount of claim 11, wherein the locking arm guide and the locking arm are comprised of polytetrafluoroethylene impregnated in anodized aluminum.

13. The mount of claim 1, wherein the lever includes a third bend towards the locking arm that indexes the lever to the first position.

14. A mount system for mounting a display device, the system comprising:
   a mount for holding a display device comprising:
      a main support comprising a front surface and a rear surface;
      a plurality of arms extending from a periphery of the main support, wherein the main support and the plurality of arms are configured to retain the display device; and
      a locking assembly connected to the rear surface of the main support, wherein the locking assembly is configured to secure the display device, the locking assembly comprising:
         a locking arm translatable relative to the main support, wherein the locking arm is configured to support the display device in a secured position; and
         a locking mechanism connected to the locking arm comprising:
            a lever connected to the locking arm for releasing the locking mechanism, wherein the locking mechanism prevents the locking arm from translating from the secured position, the lever comprising a first end that is actuatable to release the locking mechanism and a spring retainer connected to a second end of the lever; and
            a spring that applies force on the lever; and
      a back plate connected to the main support that covers a portion of the locking assembly; and
      a rotation device connected to the back plate.

15. The system of claim 14, wherein the catch plate includes a latching feature to engage notches of the lever in the second position.

16. The system of claim 14, wherein the locking mechanism comprises a catch plate that does not engage the lever when the lever is in a first position, and wherein the catch plate engages and locks the lever when the lever is in a second position.

17. The system of claim 16, wherein the catch plate includes a catch to engage notches of the lever in the second position.

18. The system of claim 14, wherein the locking assembly further comprises a locking arm guide connected to the rear surface that defines a movable path for the locking arm.

\* \* \* \* \*